(12) United States Patent
Pritchett et al.

(10) Patent No.: US 6,916,689 B2
(45) Date of Patent: Jul. 12, 2005

(54) PLASTIC CHIP-SCALE PACKAGE HAVING INTEGRATED PASSIVE COMPONENTS

(75) Inventors: Samuel D. Pritchett, Flower Mound, TX (US); Anthony L. Coyle, Plano, TX (US); Milton L. Buschbom, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 245 days.

(21) Appl. No.: 10/419,408

(22) Filed: Apr. 21, 2003

(65) Prior Publication Data

US 2003/0205400 A1 Nov. 6, 2003

Related U.S. Application Data

(62) Division of application No. 09/855,879, filed on May 15, 2001, now Pat. No. 6,586,676.
(60) Provisional application No. 60/244,673, filed on Oct. 31, 2000, and provisional application No. 60/204,262, filed on May 15, 2000.

(51) Int. Cl.[7] .......................... H01L 21/44; H01L 21/48
(52) U.S. Cl. ...................... 438/126; 438/127; 174/52.4
(58) Field of Search .............................. 438/125, 126, 438/127; 174/52.3, 52.4

(56) References Cited

U.S. PATENT DOCUMENTS

| | | | |
|---|---|---|---|
| 4,795,670 A | * | 1/1989 | Nishigaki et al. ............ 428/209 |
| 5,481,436 A | | 1/1996 | Werther |
| 5,510,758 A | * | 4/1996 | Fujita et al. ................. 333/247 |
| 5,985,693 A | * | 11/1999 | Leedy .......................... 438/107 |
| 6,021,050 A | * | 2/2000 | Ehman et al. .............. 361/793 |
| 6,362,525 B1 | | 3/2002 | Rahim |
| 6,586,676 B2 | * | 7/2003 | Pritchett et al. ........... 174/52.2 |

* cited by examiner

*Primary Examiner*—Alexander Ghyka
(74) *Attorney, Agent, or Firm*—Yingsheng Tung; Wade James Brady, III; Frederick J. Telecky, Jr.

(57) ABSTRACT

A semiconductor device has passive components integrated with the circuit and encapsulated in a plastic package for solder ball or leaded attachment. A plastic chip-scale semiconductor device has a substrate made of a plurality of patterned insulating layers alternating with patterned electrically conductive layers, the layers mutually adhering to form the substrate. The layers include a plurality of passive electrical components, such as capacitors, inductors, and resistors, and routing lines. Most routing lines terminate in a first plurality of bondable contact pads and a second plurality of solderable contact pads. The components and lines form a web and are configured mostly in a narrow peripheral band at least partially around a central substrate area, and are operable with high performance in conjunction with an integrated circuit (IC) chip. The chip is attached to the central substrate area and electrically connected to the first plurality of contact pads, respectively, whereby the passive components are integrated with the IC. Plastic encapsulation material surrounds the chip, first plurality of contact pads, and passive components such that the outline of the material is approximately the same as the outline of the chip.

15 Claims, 9 Drawing Sheets

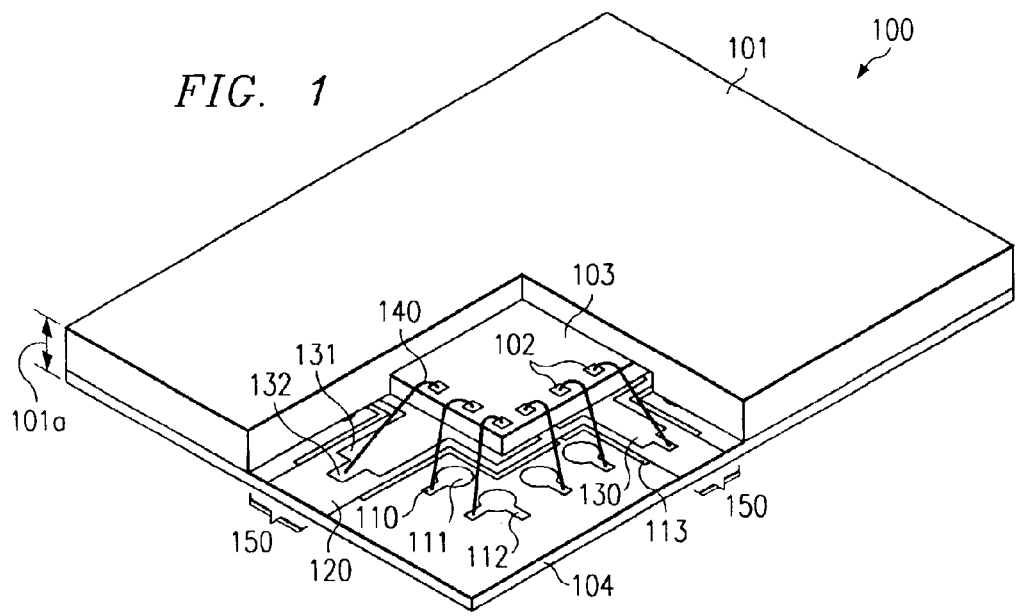

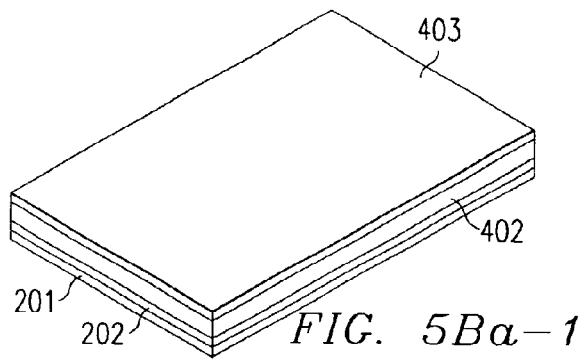
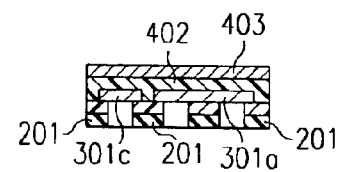
FIG. 5Ba-1
FIG. 5Ba-2
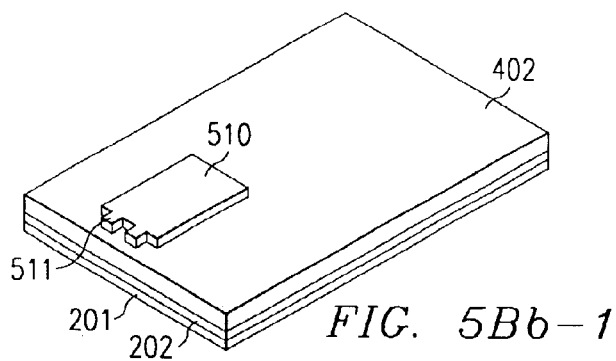
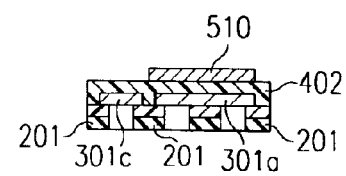
FIG. 5Bb-1
FIG. 5Bb-2
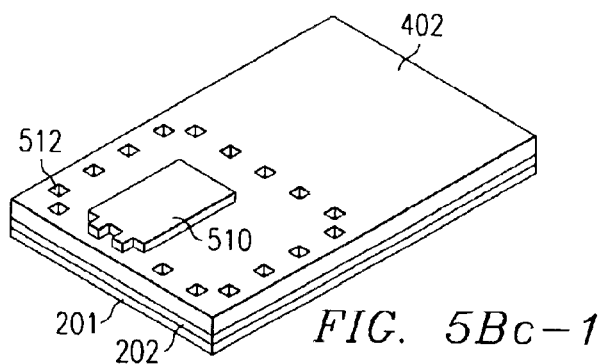
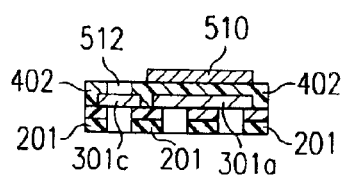
FIG. 5Bc-1
FIG. 5Bc-2

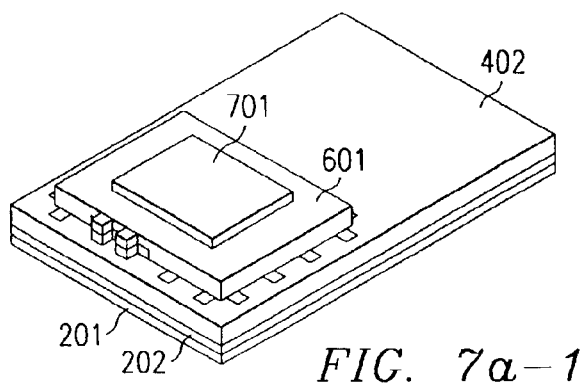
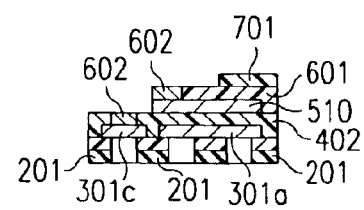
FIG. 7a-1
FIG. 7a-2
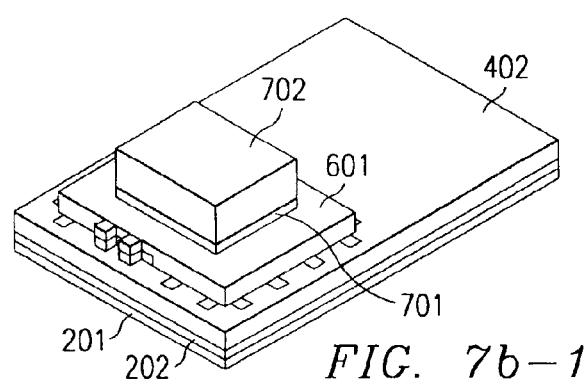
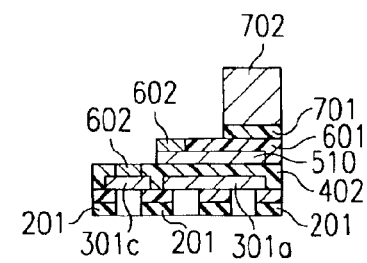
FIG. 7b-1
FIG. 7b-2
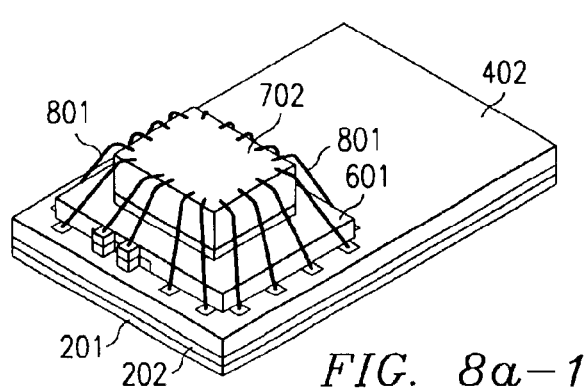
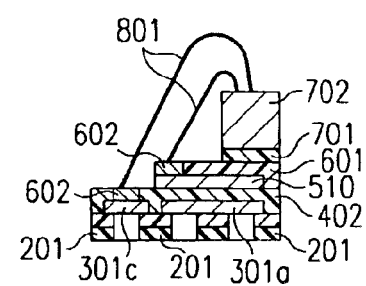
FIG. 8a-1
FIG. 8a-2

PLASTIC CHIP-SCALE PACKAGE HAVING INTEGRATED PASSIVE COMPONENTS

This a divisional application of Ser. No. 09/855,879, filed May 15, 2001, now U.S. Pat No. 6,586,676 which is a non-provisional application claiming priority from provisional application Ser. No. 60/244,673, filed Oct. 31, 2000, which claims priority of provisional application Ser. No. 60/204,262, filed May 15, 2000.

FIELD OF THE INVENTION

The present invention is related in general to the field of semiconductor devices and processes, and more specifically to plastic chip-scale packages which house passive electronic components integrated with the circuit embedded in the semiconductor chip.

DESCRIPTION OF THE RELATED ART

As portable appliances continue to integrate more functionality into smaller packages, minimization of total board space becomes more critical. On the one hand, progress in silicon technology continues to successfully integrate more and more functionality into the silicon chip for numerous products. On the other hand, a number of functions stubbornly resist the desired integration. For example, some functionality such as regulator bypass capacitance, Phase-Locked-Loop (PLL) loop filter components, and impedance matching components, cannot be efficiently integrated into current or planned silicon process technologies.

In highly integrated solutions, the placement of external components, such as regulator bypass capacitors, impacts the overall performance of the solution. If one could integrate some of these components within the product package, one could minimize parasitic effects related to inductances, capacitances and resistances, and thus offer optimized product performance.

Furthermore, in high performance digital and analog integrated circuit (IC) products, it is desirable to minimize the number of pins/leads that must be connected to other components on the printed circuit board. Integrating functional blocks, such as low-drop-out voltage regulators, and their requisite external components (for instance, bypass capacitors) allows the IC designer to distribute these functions more evenly within the IC, and in some cases to increase the number of individual bypass components. Electrical isolation between functional blocks with the IC can thus be improved. This can be achieved without increasing the number of external components, or increasing the footprint of the chip-scale package.

An urgent need has, therefore, arisen for a low-cost, reliable structure and method technology to provide integration of passive components within plastic semiconductor packages, especially chip-scale packages. The system should provide simple, no-cost-added integration especially for high-growth products such as wireless products and digital signal processors. It should be flexible and tolerant for process variations such as wire bonding versus flip-chip assembly, transfer molding versus potting encapsulation, or solder ball versus pin connections to outside parts.

The structure and method should be applicable to a wide spectrum of design, material and process variations, leading to significant savings of silicon and fabrication processes, as well as to improved device characteristics and reliability and process yield. Preferably, these innovations should be accomplished using the installed process and equipment base so that no investment in new manufacturing machines is needed.

SUMMARY OF THE INVENTION

A semiconductor device is disclosed having passive components integrated with the circuit and encapsulated in a plastic package for solder ball or leaded attachment.

In a preferred embodiment of the invention, a plastic chip-scale semiconductor device has a substrate made of a plurality of patterned insulating layers alternating with patterned electrically conductive layers, the layers mutually adhering to form the substrate. The layers comprise a plurality of passive electrical components, such as capacitors, inductors, and resistors, and routing lines. Most routing lines terminate in a first plurality of bondable contact pads and a second plurality of solderable contact pads. The components and lines form a web and are configured mostly in a narrow peripheral band at least partially around a central substrate area, and are operable with high performance in conjunction with an integrated circuit (IC) chip. The chip is attached to the central substrate area and electrically connected to the first plurality of contact pads, respectively, whereby the passive components are integrated with the IC. Plastic encapsulation material surrounds the chip, first plurality of contact pads, and passive components such that the outline of the material is approximately the same as the outline of the chip.

It is an aspect of the present invention to significantly reduce the number of external components needed for high performance operation of the IC by integrating them into the plastic device package.

Another aspect of the invention is to reduce the board footprint of the device.

Another aspect of the invention is to optimize the distribution of functional blocks (such as LDO regulators) without increasing external pin count, resulting in optimal functional block electrical isolation.

Another aspect of the invention is to provide design and layout concepts, process methods, and assembly alternatives which are flexible so that they can be applied to many families of semiconductor IC products, and are general, so that they can be applied to several generations of products.

Another aspect of the invention is to provide a low-cost and uncomplicated process for fabrication, testing and assembly, using thin, flexible, patternable and adhesive plastic films.

Another aspect of the invention is to use only design concepts and processes most commonly used and accepted in the fabrication of IC devices, thus avoiding the cost of new capital investment and using the installed fabrication equipment base.

These aspects have been achieved by the teachings of the invention concerning design concepts and process flow suitable for mass production. Various modifications have been successfully employed to satisfy different selections of product materials and packages.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 3 depicts schematically continuing process steps in the substrate fabrication method according to the invention: Laminating; patterning first level metal.

FIG. 4 depicts schematically continuing process steps in the substrate fabrication method according to the invention: Laminating; patterning second level metal.

FIGS. 5A and 5B depict schematically continuing process steps in the substrate fabrication method according to the invention: Patterning second adhesive layer.

FIG. 7 depicts schematically continuing process steps in the substrate fabrication method according to the invention: Attaching chip.

FIG. 8 depicts schematically continuing process steps in the substrate fabrication method according to the invention: Overmolding.

FIG. 9 depicts schematically continuing process steps in the substrate fabrication method according to the invention: Attaching solder balls; singulating device.

DETAILED DESCRIPTION OF THE PREFERRED EMBODIMENTS

Figures 1, 2D:
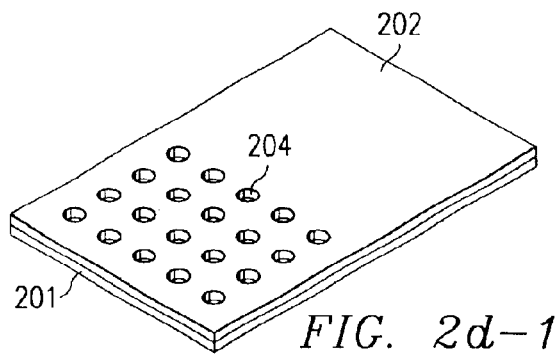
FIG. 1 shows a perspective simplified view of a preferred embodiment of the invention, illustrating a molded chip-scale integrated circuit (IC) device having a portion of the encapsulation opened for exposing portions of the passive components integrated with the IC chip.
Figures 2, 2D:
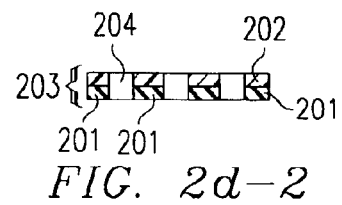
FIG. 2 depicts schematically the first process steps in the substrate fabrication method according to the invention: Laminating; creating of via holes.
Figures 1, 3A:
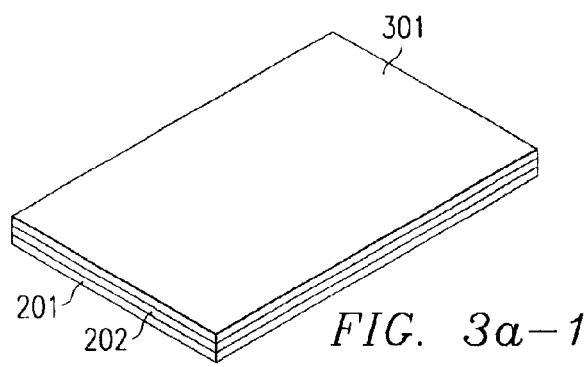
Figures 2, 3A:
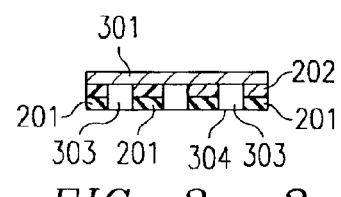
Figures 1, 3B:
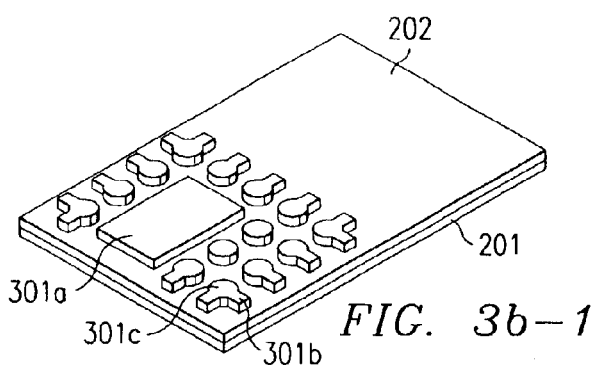
Figures 2, 3B:
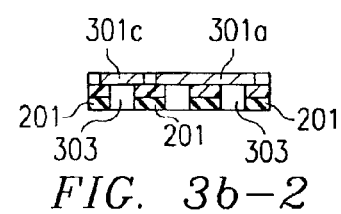

FIG. 1 illustrates a perspective, simplified view of a completed chip-scale IC device, generally designated 100, according to the invention. The device has a portion of the encapsulation 101 opened for exposing portions of the passive components 150 which are integrated with the IC chip 103 according to the invention. The illustrated device is generic; this means, additional processing can specialize it as a Land-Grid Array, Ball-Grid Array, or Pin-Grid array package.

In FIG. 1, a generic chip-scale device 100 is shown with a structure similar to the MicroStarJunior™ package fabricated by Texas Instruments, Dallas, Tex., U.S.A. In this package, a baseline polymer film 104 (for example, polyimide) is punched with an outline adding typically less than 20% to the outline of the silicon chip area. For some device types, the baseline film may have substantially the same outline.

As defined herein, the term "outline" relates to the overall width and length of the IC package of the present invention. The outline of the package is also referred to as the footprint of the package, because it defines the surface area on a wiring or assembly board that the package will occupy. The term "substantially the same" refers to the difference in size of the outlines of the silicon chip and the baseline film (the package substrate). The difference may be as small as 2%, or may vanish altogether.

The baseline film 104 is made of electrically insulating materials such as polyimide, preferably in the thickness range from about 40 to 80 $\mu$m; in some instances, it may be thicker. Other suitable materials include PCB resin, FR-4 (which is an epoxy resin), or a cyanate ester resin (sometimes reinforced with a woven glass cloth). These materials are commercially available from several sources; as examples, in the U.S.A., companies include 3-M and Sheldahl; in Japan, Shinko, Shindo, Sumitomo, and Mitsui; and in Hong Kong, Compass.

On top of, and adhering to, baseline film 104 is the first metal foil. Structures of passive electrical components are formed from this first foil. Examples shown in FIG. 1 are:

bond pads 110 for attaching the stitch bonds of bonding wires (or wedge bonds of bonding ribbons).
contact pads 111 for attaching solder balls or bumps;
conductive routing lines 112;
lower plates 113 of capacitors.

Further formed from the first metal foil may be the following structures not shown in FIG. 1:
inductors;
resistors;
distributed components;
networks of passive components and interconnected structures.

It is within the scope of the invention that at least portions of these passive structures (for instance, inductors and capacitors) may be positioned under the chip 103.

The thickness of the metal foil is preferably between about 15 and 40 $\mu$m. Preferred foil materials include copper, copper alloys, gold, silver, palladium, platinum, and stacked layers of nickel/gold and nickel/palladium. The thickness of the adhesive layer between the baseline film 104 and the first metal foil is typically between 8 and 15 $\mu$m.

On top of, and adhering to, the first metal foil is the dielectric film 120. It is important for the present invention that dielectric film 120 is patternable so that it can be used to continue the formation of certain passive components. In FIG. 1, film 120 is shown to be patterned to form the passive components 150 (capacitors). Furthermore, the patterned film 120 is shown to extend to the edge of the package outline in specific regions. This feature provides low cost alignment and overlay in the manufacturing process. A variety of other film patterns are possible.

The insulating film 120 may be selected from a group consisting of polymers, polyimides, PCB resin, solder masks and stacked layers made of at least one dielectric and one adhesive films. The film thicknesses range from about 40 to 80 $\mu$m for polyimides, 8 to 15 $\mu$m for adhesives, and 15 to 35 $\mu$m for solder masks.

On top of, and adhering to, dielectric film 120 is the second metal foil 130. Structures are formed from this metal foil 130, which complete the formation of passive electrical components. In FIG. 1, the upper plates 131 of capacitors are shown, together with bond pads 132 for attaching the stitch bond of bonding wires (or wedge bonds of bonding ribbons). Inductors can also be implemented in metal foil 130 (not shown in FIG. 1).

On top of, and attached to, second metal foil 130 is the IC chip 103 with a plurality of contact pads 102. It is understood that contact pads 102 could either be formed with bondable metal as bond pads for attaching bonding wires 140, as illustrated in FIG. 1; or with solderable metal as contact sites for attaching solder balls (flip-chip method, not shown in FIG. 1); or with attachable conductors as contact sites for attaching z-axis conducting polymers (not shown in FIG. 1).

Encapsulation material 101 is typically an epoxy-based molding compound with fillers when transfer molding is employed as the chip encapsulation technique. When desired, the thickness 101a of the encapsulation material can be selected to be less than 1.0 mm.

The flexibility of the generic configuration provided by the present invention allows modifications of the structures illustrated in FIG. 1 in order to achieve a number of device advantages relative to passive components:

Passive capacitors can be formed by adding a single dielectric layer to a MicroStarJunior™ package; the capacitors and the other passive components can be integrated into the package.

The bypass capacitor bottom plate can be connected directly to several contact balls; the inductance can thus be minimized.

The capacitor bottom plates are not electrically connected. This eliminates common-mode inductance and further isolates functional blocks from one another and improves overall solution performance.

The extensions of the capacitor dielectric layer to the edge of the package allows for an array of packages to be incorporated onto a single tape. It minimizes the cost of adding this second layer and the alignment thereof. The second dielectric film can be further extended to the tape carriage alignment pattern.

Inductors can be co-integrated with capacitors without adding additional film layers.

A plurality of external passive components is eliminated; the total footprint on the board is thus minimized.

An optimal distribution of functional blocks (such as LDO regulators) can be achieved without increasing external pin count and providing optimal functional block electrical isolation.

The method of fabricating a semiconductor device as pictured in FIG. 1 having an IC chip assembled in a plastic chip-scale package, integrated with a plurality of passive electrical components, is illustrated in FIGS. 2 through 9. Each Figure describes a number of process steps illustrated by a schematic cross section of the part or structure at this process step, as well as by a simplified top view of the result of the respective process step. Starting in FIG. 2, the process steps include:

Providing an insulating first film 201.

Attaching an adhesive second film 202 to the insulating first film 201, creating laminated film 203.

Forming vias 204 (by a punching process, a chemical etch technique, or a laser process) extending through both films 201 and 202 from one surface to the opposite surface.

Continuing in FIG. 3, the process steps include:

Attaching a first metal foil 301 over the adhesive second foil (laminated stack 203 with via holes 204), covering one end 303 of the vias, while leaving the opposite end 304 open.

Patterning the first metal foil 301 to form first portions of the passive electrical components 301a, routing lines 301b, and contact pads 301c.

Figures 1, 4A:
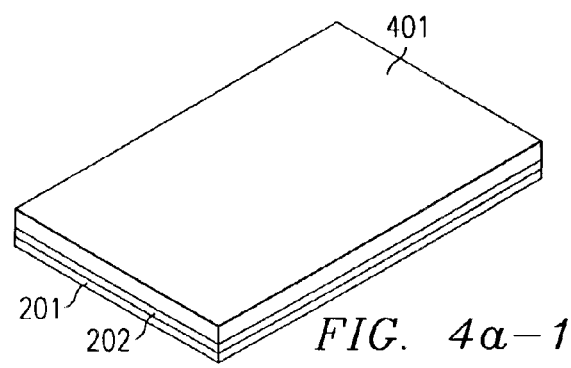
Figures 2, 4A:
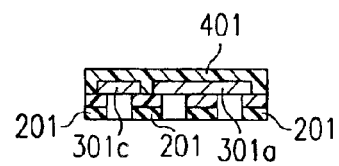

Continuing in FIG. 4, the process steps include:

Attaching an adhesive third film over the patterned foil and said first and second insulating films, the adhesive third film being a patternable dielectric. This step of attaching is performed by forming a film 401, by laminating, or by dispensing/screening adhesive material, or by depositing adhesive material. The process flow continues along one of two routes:

Route 1 is displayed in FIG. 5B.

Figure 5A:
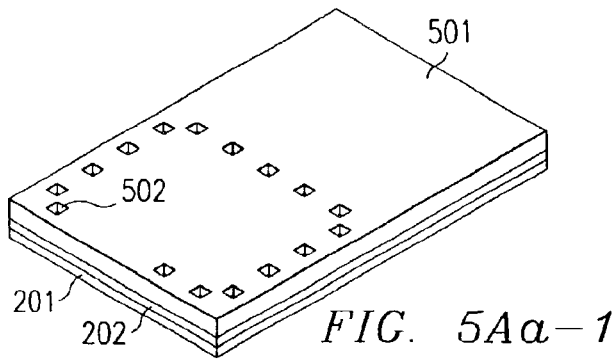
Figure 5A:
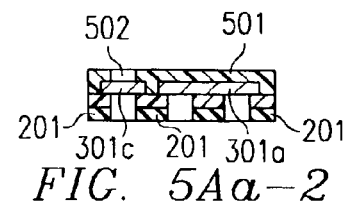
Figure 5A:
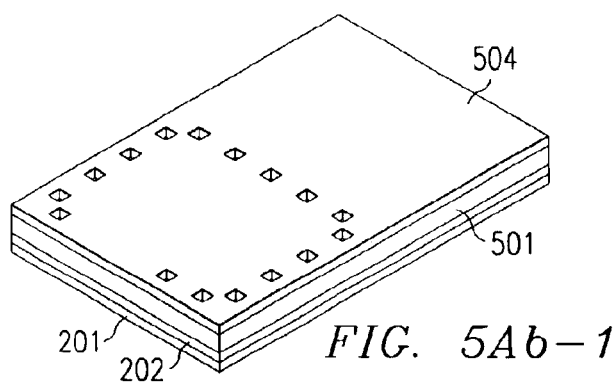
Figure 5A:
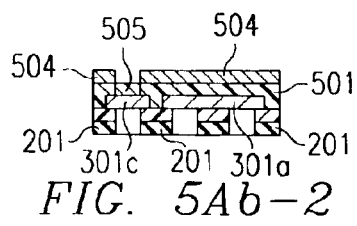
Figure 5A:
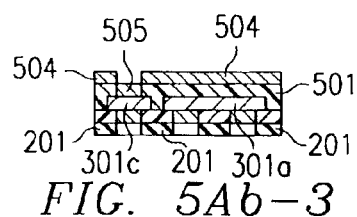
Figure 5A:
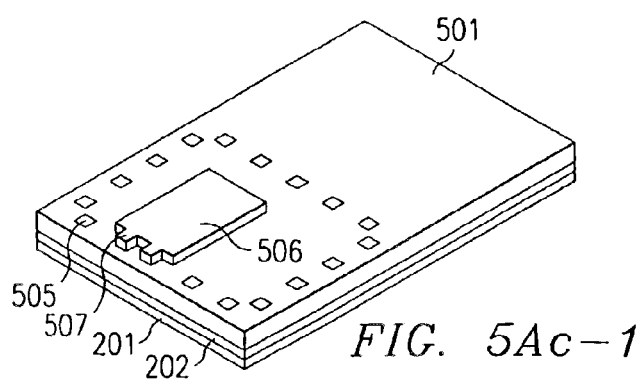
Figure 5A:
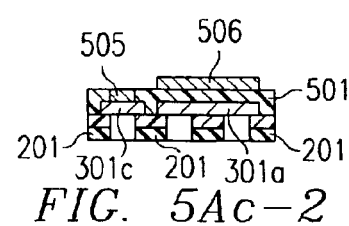
Figure 5A:
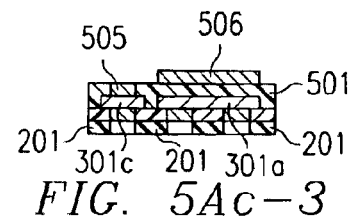
Figure 6A:
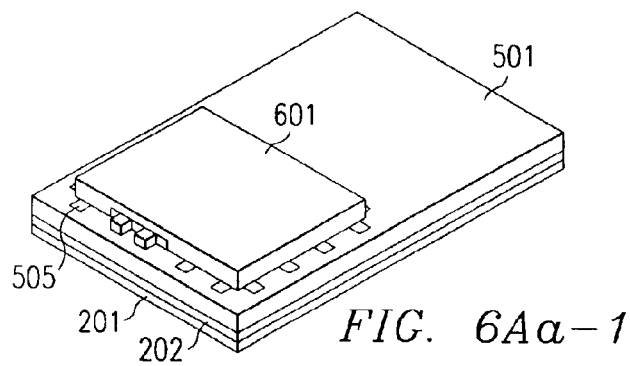
FIGS. 6A and 6B depict schematically continuing process steps in the substrate fabrication method according to the invention: Applying solderable metal surfaces.
Figure 6A:
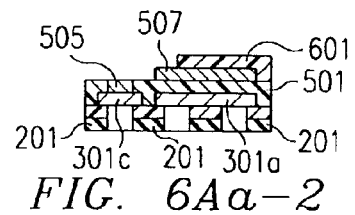
Figure 6A:
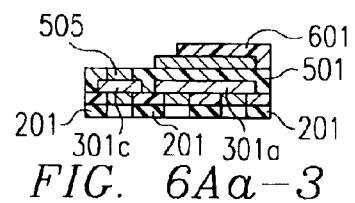
Figure 6A:
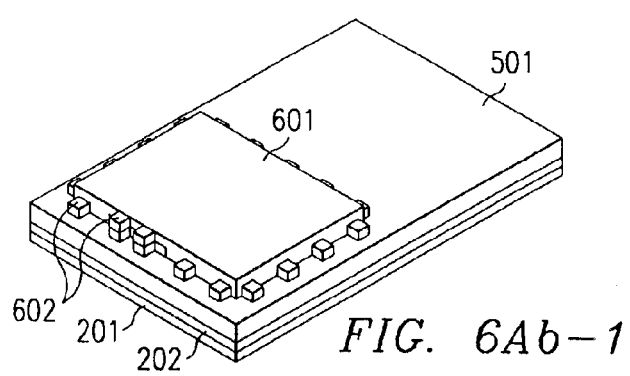
Figure 6A:
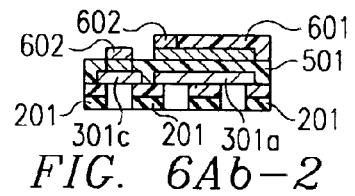
Figure 6A:
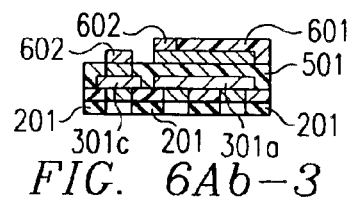
Figure 6B:
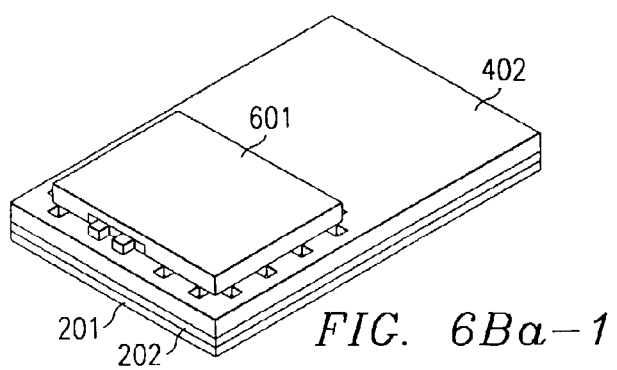
Figure 6B:
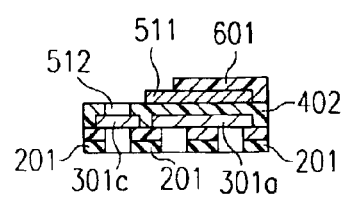
Figure 6B:
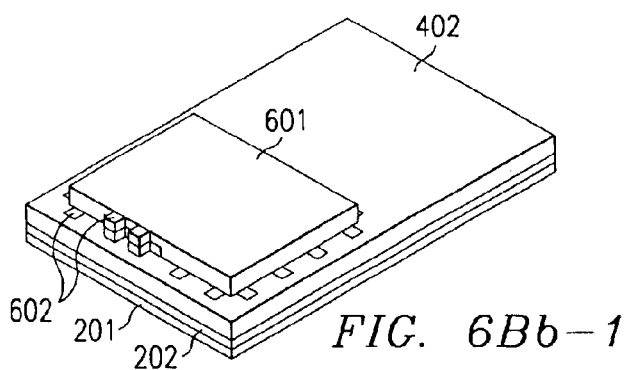
Figure 6B:
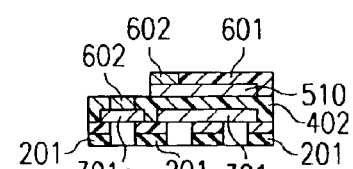

Route 2 is displayed in FIG. 5A.

Continuing in FIG. 5A for Route 2, the process steps include:

Patterning the adhesive third film (401/402 in FIG. 4) to form the dielectric portions 501 of the passive components and to form openings 502 extending to the contact pads 301c on the first foil 301.

Creating a second metal foil 504 by a sputtering (FIG. 5Ab-2) and/or electroplating (FIG. 5Ab-3) deposition technique, thereby filling said openings 502 with metal to form contact pads 505.

First: Depositing seed metal by sputtering technique.

Second: Depositing metal layer by continued sputtering; or depositing metal layer by electroplating technique.

Patterning and etching the created second metal foil 504 to define the second metal portions 506 of the passive electrical components, routing lines, and contact pads 507, thereby completing the formation of the passive components.

Continuing in FIG. 5B for Route 1, the process steps include:

Attaching (laminating) a second metal foil 403 over the adhesive film 402.

Patterning the second metal foil 403 to form second portions 510 of the passive electrical components, routing lines, and contact pads 511, thereby completing the formation of the passive components.

Patterning the adhesive third film 402 to create openings 512 and expose the contact pads 301c on the first metal foil 301.

Continuing in FIG. 6, the process steps include:

Attaching an electrically insulating adhesive fourth film 601 to the second metal foil 506/510 so that it leaves the exposed contact pads 505/507 (FIG. 6A) and 301c/511 (FIG. 6B) on both the first and second metal foil unprotected. A suitable material for the insulating adhesive film 601 is a so-called "soldermask", attached in film form or by screen application.

Selectively depositing a bondable and(or solderable metal 602 onto the exposed contact pads 505/507 (FIG. 6A) and 301c/511 (FIG. 6B) on the first and second metal foils.

Continuing in FIG. 7, the process steps include:

Applying chip attach adhesive 701 either as polymer dispensed material or as polymer film material.

Mechanically attaching semiconductor IC chip 702 to the adhesive 701 and thus the substrate.

Figures 1, 8B:
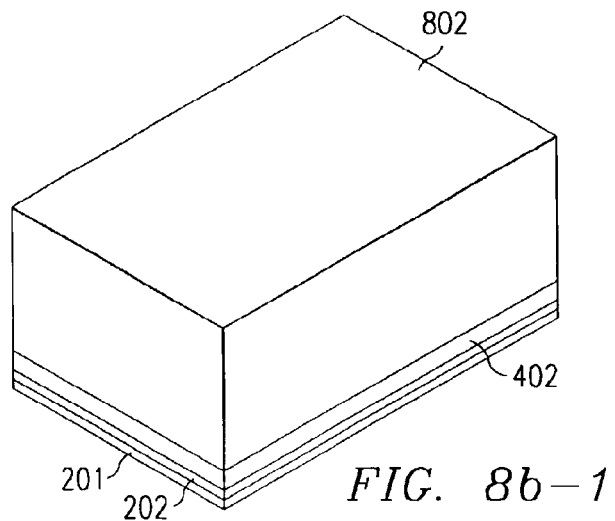
Figures 2, 8B:
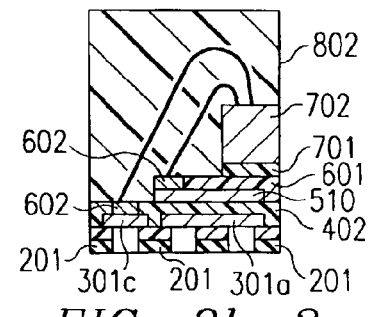
Figures 1, 9A:
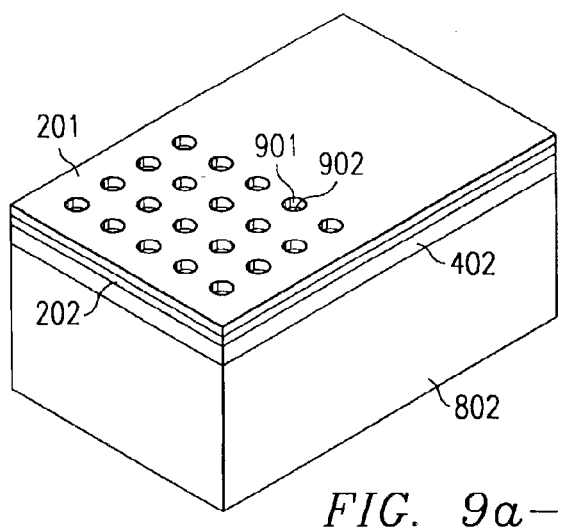
Figures 2, 9A:
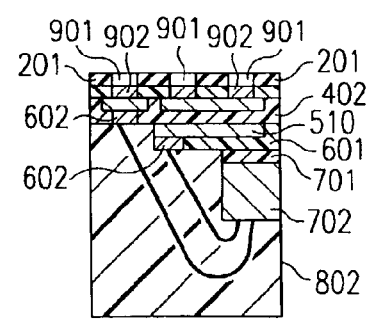
Figures 1, 9B:
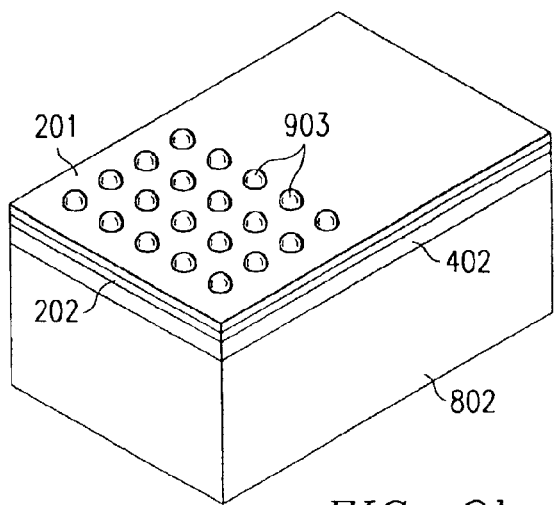
Figures 2, 9B:
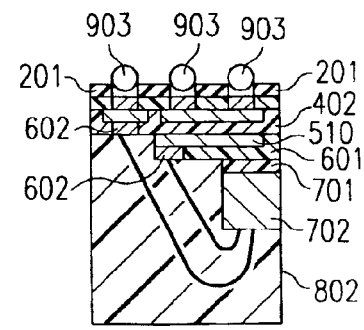
Figures 1, 9C:
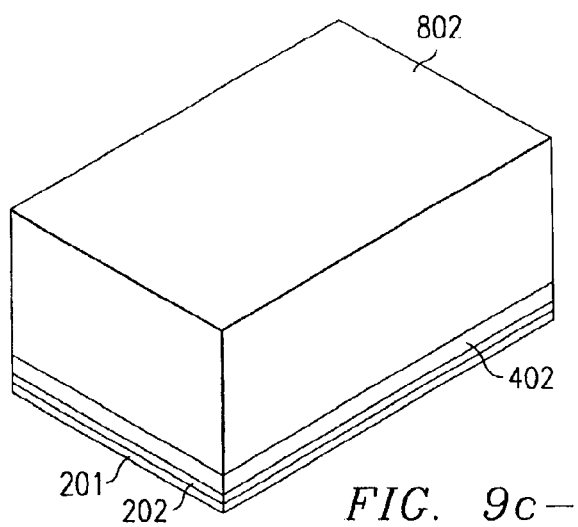
Figures 2, 9C:
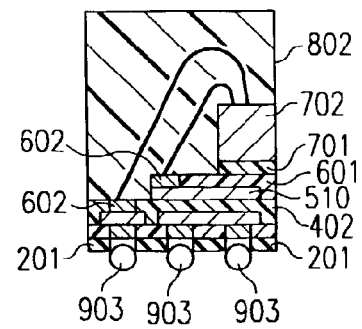

Continuing in FIG. 8, the process steps include:

Electrically connecting IC chip 702 to the metal 602 on the contact pads, which constitute the first plurality of contact pads. Shown in FIG. 8 is the connecting method based on bonding wires or ribbons 801. The passive components in the substrate are thereby integrated with the IC of chip 702.

Encapsulating chip 702, the electrical connections 703, the contact pad metals 602 (the first plurality of contact pads), and the passive components in plastic material 802 (molding compound or glob top).

Alternative methods for mechanically attaching and electrically connecting chip 702 to the substrate comprise the use of solder "balls", attached to the contact pads on the active chip surface as well as to the contact pads of the substrate ("flip-chip" technique), or the use of z-axis conducting polymers. These assembly methods are not illustrated in FIGS. 7 and 8.

Continuing in FIG. 9, the process steps include:

Preparing the second plurality of contact pads 901 for solder attach by depositing solderable metal 902.

Attaching solder balls 903. As defined herein, the term solder "ball" does not necessarily imply that the solder contacts are necessarily spherical. They may have various forms, such as semispherical, half-dome, truncated cone, or generally bump. The exact shape is a function of the deposition technique (such as evaporation, plating, or prefabricated units), reflow technique (such as infrared or radiant heat), and material composition. Solder balls may be selected from a group consisting of pure tin, tin alloys including tin/copper, tin/indium, tin/silver, tin/bismuth, tin/lead, and conductive adhesive compounds.

Singulating the compound structure into discreet devices, preferably by a sawing technique, thereby creating a package having an outline which is approximately the same as the chip outline ("chip-scale package").

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A method of fabricating a semiconductor device comprising a high performance integrated circuit chip having an outline and an active and a passive surface, comprising the steps of:

forming a substrate from a plurality of patterned insulating films alternating with and adhering to patterned metal foils such that said substrate comprises a plurality of passive electrical components, routing lines, and a first and second plurality of bondable and solderable contact pads;

mechanically attaching said chip to said substrate and electrically connecting said chip to said first plurality of contact pads, thereby integrating said passive components with said circuit; and encapsulating said chip, electrical connections, first plurality of contact pads, and passive components in plastic material, thereby creating a package having an outline which is approximately the same as said chip outline, while leaving said second plurality of contact pads open.

2. The method according to claim 1 further comprising the step of placing solder material on said second plurality of contact pads, thereby enabling attachment of said device to other parts.

3. The method according to claim 1 further comprising the step of separating the resulting composite structure into discreet device units.

4. The method according to claim 1 wherein said step of forming said substrate comprises the steps of:

providing an insulating first film;

attaching an adhesive second film to said insulating first film;

forming vias extending through both said films from one surface to the opposite surface;

attaching a first metal foil over said adhesive second film, covering one end of said vias, while leaving the opposite end open;

patterning said first metal foil to form first portions of said passive electrical components, routing lines, and contact pads;

attaching an adhesive third film over said patterned foil and said first and second insulating films, said adhesive third film being a patternable dielectric;

attaching a second metal foil over said adhesive third film;

patterning said second foil to form second portions of said passive electrical components, routing lines, and contact pads, thereby completing the formation of said passive components;

patterning said adhesive third film to expose said contact pads on said first foil;

attaching an electrically insulating adhesive fourth film to the second metal foil so that it leaves said exposed contact pads on both said first and second metal foils unprotected; and selectively depositing a bondable and solderable metal onto said exposed contact pads on said first and second metal foils.

5. The method according to claim 1 wherein said steps of attaching and connecting said chip comprise the steps of:

mechanically attaching said passive chip surface to said second metal foil using an adhesive polymer material;

electrically connecting said active chip surface to said exposed contact pads on both said first and second metal foils using bonding wires or ribbons.

6. The method according to claim 1 wherein said steps of attaching and connecting said chip comprise the step of:

mechanically attaching and electrically connecting said active chip surface to said contact pads on said first and second metal foils using solder balls.

7. The method according to claim 1 wherein said step of forming said substrate comprises the steps of:

providing an insulating first film;

attaching an adhesive second film to said insulating first film;

forming vias extending through both said films from one surface to the opposite surface;

attaching a first metal foil over said adhesive second film, covering one end of said vias, while leaving the opposite end open;

patterning said first foil to form first portions of passive electrical components, routing lines, and contact pads;

attaching an adhesive third film over said patterned foil and said first and second insulating films, said adhesive third film being a patternable dielectric;

patterning said adhesive third film to form the dielectric portions of said passive components and to form openings extending to said contact pads on said first foil;

selectively depositing metal to fill said openings;

providing a patterned metal layer, thereby completing the formation of said passive components;

attaching an electrically insulating adhesive fourth film to the second metal foil so that it leaves said exposed contact pads on both said first and second metal foils unprotected; and selectively depositing a bondable and solderable metal onto said exposed contact pads on said first and second metal foils.

8. The method according to claim 7 wherein said steps of selectively depositing metal and providing a patterned metal layer comprise the steps of:

depositing a seed metal layer by a sputtering technique;

depositing a metal layer by additional sputtering or by an electroplating technique, thereby filling said openings and completing the formation of said metal layer functioning as said second metal foil; and patterning and etching said metal layer, thereby completing the formation of said passive components.

9. The method according to claim 7 wherein said step of providing a patterned metal layer comprises the steps of:

attaching a second metal foil over said adhesive third film; and patterning said second foil to form second portions of said passive electrical components, routing lines, and contact pads, thereby providing electrical contact to said metal-filled openings.

10. The method according to claim 7 wherein said step of providing a patterned metal layer comprises the steps of:
applying photoresist to photo-define the pattern of the second portions of said passive electrical components;
selectively depositing metal to form said second portions of said passive electrical components; and
stripping said photoresist.

11. The method according to claim 4 or 7 wherein said step of attaching an adhesive film is performed by laminating a film, or by dispensing/screening adhesive material, or by depositing adhesive material.

12. The method according to claim 4 or 7 wherein said step of forming vias is performed by a punching process, a chemical etch technique, or a laser process.

13. The method according to claim 4 or 7 wherein said step of attaching a conductive foil is performed by rolling or pressing.

14. The method according to claim 4 or 7 wherein said steps of patterning said metal foils comprise the steps of:
applying photoresist material;
exposing and developing the pattern;
etching the metal foil; and
removing the photoresist material.

15. The method according to claim 4 or 7 wherein said step of selectively depositing is performed by a selective plating process.

* * * * *